United States Patent
Kim et al.

(10) Patent No.: US 9,412,674 B1
(45) Date of Patent: Aug. 9, 2016

(54) SHIELDED WIRE ARRANGEMENT FOR DIE TESTING

(71) Applicant: Xilinx, Inc., San Jose, CA (US)

(72) Inventors: Myongseob Kim, Pleasanton, CA (US); Henley Liu, San Jose, CA (US); Cheang-Whang Chang, Mountain View, CA (US); Sanjiv Stokes, Los Altos, CA (US)

(73) Assignee: XILINX, INC., San Jose, CA (US)

( * ) Notice: Subject to any disclaimer, the term of this patent is extended or adjusted under 35 U.S.C. 154(b) by 86 days.

(21) Appl. No.: 14/062,805

(22) Filed: Oct. 24, 2013

(51) Int. Cl.
  *H01L 23/58* (2006.01)
  *H01L 29/10* (2006.01)
  *H01L 21/66* (2006.01)
  *G01R 31/26* (2014.01)

(52) U.S. Cl.
  CPC ............... *H01L 22/34* (2013.01); *H01L 22/14* (2013.01)

(58) Field of Classification Search
  CPC ............... H01L 22/32; H01L 2224/05554; G01R 31/2884
  USPC ............................................................ 257/48
  See application file for complete search history.

(56) References Cited

U.S. PATENT DOCUMENTS

| | | | |
|---|---|---|---|
| 2003/0063450 A1* | 4/2003 | Miller | H01L 23/13 361/783 |
| 2003/0219913 A1* | 11/2003 | Pourkeramati et al. | 438/12 |
| 2003/0234393 A1* | 12/2003 | Cowles et al. | 257/48 |
| 2004/0046579 A1* | 3/2004 | Chraft | G01R 1/07314 324/750.27 |
| 2007/0188188 A1* | 8/2007 | Or-Bach et al. | 326/38 |
| 2011/0012633 A1* | 1/2011 | Rahman | G01R 31/318544 324/754.07 |
| 2012/0061853 A1* | 3/2012 | Su | H01L 21/563 257/778 |
| 2012/0169367 A1* | 7/2012 | Kuo | G01R 1/06772 324/756.03 |
| 2012/0194210 A1* | 8/2012 | Kuo | G01R 1/07378 324/754.07 |
| 2013/0297981 A1* | 11/2013 | Gu | G01R 31/3177 714/727 |
| 2014/0029150 A1* | 1/2014 | Fledell | H02H 9/02 361/93.9 |

* cited by examiner

*Primary Examiner* — Matthew Landau
*Assistant Examiner* — Igwe U Anya
(74) *Attorney, Agent, or Firm* — Kevin T. Cuenot

(57) ABSTRACT

An integrated circuit includes a die having a conductive layer. The conductive layer includes a data wire, a first power supply wire of a first voltage potential, and a second power supply wire of a second voltage potential different from the first voltage potential. A segment of the data wire is located between, and substantially parallel to, a segment of the first power supply wire and a segment of the second power supply wire. Further, the first power supply wire is coupled to a first probe structure; and, the second power supply wire is coupled to a second probe structure.

20 Claims, 5 Drawing Sheets

SHIELDED WIRE ARRANGEMENT FOR DIE TESTING

FIELD OF THE INVENTION

This disclosure relates to integrated circuits (ICs) and, more particularly, to testing IC dies.

BACKGROUND

An integrated circuit (IC) that includes two or more dies within a single package is referred to as a multi-die IC. One type of multi-die IC, referred to as a "stacked die IC," is formed by stacking multiple dies. In some cases, the multi-die IC utilizes an entirely passive die, referred to as an "interposer," to which one or more other dies are attached. The passive interposer die provides signal lines, e.g., wires, that communicatively link the various dies attached thereto.

Testing passive interposer dies is often a challenging endeavor. A passive interposer die may include thousands of wires. Under ideal circumstances, each wire would be electrically tested. For example, in-line defect inspection of wires may be performed. Within a production environment, however, time and cost significantly limit test coverage for the wires when using in-line defect inspection. As such, 100% test coverage of wires is not realistically possible.

In other cases, dummy test wires may be added to a passive die interposer for testing purposes. While dummy test wires may provide some benefits, coverage of usable wires within the passive interposer die remains an issue. Moreover, to achieve an adequate level of testing, the dummy test wires themselves may use significant area of the passive die interposer. The area occupied by the dummy test wires may significantly reduce the area available for non-dummy circuit elements that are available for use within a circuit design of a user.

SUMMARY

An integrated circuit includes a die having a conductive layer. The conductive layer includes a data wire, a first power supply wire of a first voltage potential, and a second power supply wire of a second voltage potential different from the first voltage potential. A segment of the data wire is located between, and substantially parallel to, a segment of the first power supply wire and a segment of the second power supply wire. Further, the first power supply wire is coupled to a first probe structure; and, the second power supply wire is coupled to a second probe structure.

A wafer includes a plurality of dies separated by portions of a scribe region, a plurality of first probe structures, and a plurality of second probe structures. Each die includes a conductive layer forming a data wire, a first power supply wire configured for a first voltage potential, and a second power supply wire configured for a second voltage potential different from the first voltage potential. A segment of the data wire is located between, and parallel to, a segment of the first power supply wire and a segment of the second power supply wire. Each first power supply wire is coupled to a different first probe structure of the plurality of first probe structures. Each second power supply wire is coupled to a different second probe structure of the plurality of second probe structures.

A method includes forming a data wire, a first power supply wire, and a second power supply wire within a conductive layer of a die. A segment of the data wire is located between a segment of the first power supply wire and a segment of the second power supply wire. The method further includes forming a first probe structure coupled to the first power supply wire and forming a second probe structure coupled to the second power supply wire. A short circuit test of the first power supply wire and the second power supply wire is conducted using the using the first probe structure and the second probe structure.

BRIEF DESCRIPTION OF THE DRAWINGS

FIGS. 6-1 and 6-2 are top views of an exemplary interposer wafer.

FIGS. 7-1 and 7-2 are diagrams illustrating exemplary portions of the interposer wafers of FIGS. 6-1 and 6-2 in cross section.

DETAILED DESCRIPTION OF THE DRAWINGS

Figure 1:
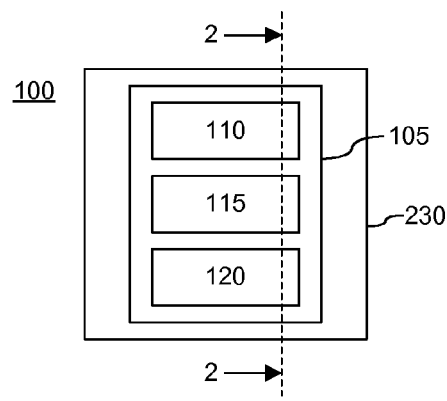
FIG. 1 is a block diagram illustrating a top view of an exemplary multi-die integrated circuit (IC).

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details provided within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features.

This disclosure relates to integrated circuits (ICs) and, more particularly, to testing IC dies. A multi-die IC is an IC formed of two or more dies that operate cooperatively within a single package. One type of multi-die IC is referred to as a "stacked die IC." A stacked die IC includes an interposer die (interposer) to which one or more other dies are attached. The interposer generally is a passive die. As used herein, a "passive die" is a die that does not include any active devices. As such, a passive die does not include any p-n or n-p junctions. Within this specification, the term "die" refers to an "integrated circuit die."

An interposer includes a significant number of wires implemented using one or more conductive layers. The wires may be used to establish electrical connectivity between nodes within the one or more other dies that are attached to the interposer. In order to ensure that the resulting multi-die IC functions properly, interposers are tested to ensure that the dies operate as intended, e.g., are "known good dies." Such testing is preferably conducted prior to attachment of other dies to the interposers. Part of this known good die testing involves adequately testing the wires implemented within the interposer.

The inventive arrangements described within this disclosure provide wire arrangements that facilitate testing of wires in a die such as an interposer. Methods relating to the formation of the wires and the utilization of the wires for testing also are described. In general, the wire arrangements include a data wire located between two power supply wires (power wires). The power wires are intended for, or of, different voltage potentials. For example, one power wire is configured as a ground (Vss) wire, while the other power wire is configured as a higher voltage potential (Vcc) wire. The data wire is implemented between the two power wires.

The power wires are coupled to probe structures thereby allowing the wire arrangement to be probed to determine whether a short circuit exists. In one example, the probe structures are implemented as probe pads. In another example, the probe structures are implemented as solder bumps. In some cases, the interposer may be tested using the wire arrangements while the interposer is still in wafer form. In other cases, the interposer may be tested using the wire arrangements after the wafer is diced or separated into individual interposers. The wire arrangements described support testing while also functioning as usable circuitry in the resulting multi-die IC. More particularly, the wire arrangements are not dedicated test structures usable only for testing that take away usable area of the dies from circuitry that is available for implementation of a user circuit design when the multi-die IC is in the field.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is a block diagram illustrating a top view of an exemplary multi-die IC (IC) 100. IC 100 illustrates an example of a packing approach to stacking multiple dies within a single package. IC 100 includes an interposer 105, a die 110, a die 115, a die 120, and a substrate 230. Each of dies 110, 115, and 120 is attached to a surface, i.e., a top surface, of interposer 105. Interposer 105 is attached to a top surface of package substrate 230.

Interposer 105 is a die having a planar surface on which dies 110, 115, and 120 are horizontally stacked. As shown, dies 110, 115, and 120 are located on the planar surface of interposer 105 side-by-side. Although interposer 105 is shown to include three dies in FIG. 1, it should be appreciated that IC 100 is shown for purposes of illustration only. A multi-die IC may include fewer than three dies attached to an interposer or more than three dies attached to an interposer.

Interposer 105 provides a common mounting surface and electrical coupling point for each of dies 110, 115, and 120. The manufacturing of interposer 105 can include one or more process steps that allow the deposition of one or more conductive layers that are patterned to form wires. These conductive layers may be formed of aluminum, gold, copper, nickel, various silicides, and/or the like. Interposer 105 can be manufactured using one or more additional process steps that allow the deposition of one or more dielectric or insulating layer(s) such as, for example, silicon dioxide. Interposer 105 also may include vias and through vias (TVs). TVs may be through silicon vias (TSVs), through glass vias (TGVs), or other via structures depending upon the particular materials used to implement interposer 105 and the substrate thereof. When interposer 105 is implemented as a passive die, interposer 105 may only have various types of solder bumps, vias, wires, TVs, and under bump metallization (UBM). When implemented as an active die, however, interposer 105 may include additional process layers forming one or more active devices.

Each of dies 110, 115, and 120 may be implemented as a passive die or an active die including one or more active devices. For example, one or more of dies 110, 115, and 120 may be memory dies, processor (central processing unit) dies, dies having programmable circuitry, application specific IC dies, mixed signal dies, or the like. Further, die 110 may be implemented as one type of die, while die 115 is implemented as another different type of die, and die 120 is implemented as yet another different type of die. For example, IC 100 can include a processor die, a programmable IC die, and a memory die coupled to interposer 105. In another example, IC 100 may be formed of two memory dies and a processor die attached to interposer 105. The examples provided herein are for purposes of illustration only and not intended to be limiting.

As used herein, a "programmable die" refers to a die that includes programmable circuitry and, as such, may be programmed to perform specified logic functions. A specific example of a programmable die is a field programmable gate array (FPGA) die. An FPGA die typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA die by an external device. The collective states of the individual memory cells then determine the function of the FPGA die.

Another specific example of a programmable die is a complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable dies, the functionality of the die is controlled by data bits provided to the die for that purpose. The data bits can be stored in volatile memory (e.g., static memory cells, as in FPGAs and some CPLDs), in non-volatile memory (e.g., FLASH memory, as in some CPLDs), or in any other type of memory cell.

Other exemplary programmable dies may be implemented in other ways, e.g., using fuse or antifuse technology. The phrase "programmable die" can include, but is not limited to these types of dies and further can encompass dies that are only partially programmable. For example, a programmable die may include a combination of hard-coded transistor logic and a programmable switch fabric that programmably interconnects the hard-coded transistor logic. It should be appreciated that a programmable die may include one or more portions of programmable circuitry and one or more portions of other circuitry not programmable such as analog circuitry or other fixed circuitry such as a hardwired processor or the like.

Figure 2:
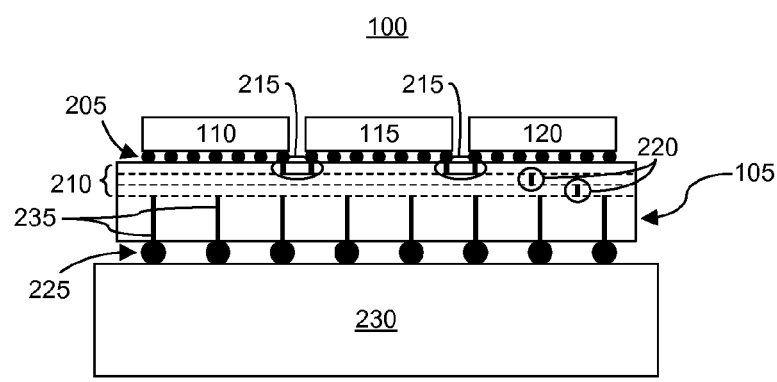
FIG. 2 is a cross-sectional side view of the multi-die IC of FIG. 1.

FIG. 2 is a cross-sectional side view of multi-die IC 100 of FIG. 1. More particularly, FIG. 2 illustrates a view of IC 100 of FIG. 1 taken along cut-line 2-2. Each of dies 110, 115, and 120 is electrically and mechanically coupled to a first planar surface of interposer 105 via solder bumps 205. In one example, solder bumps 205 are implemented as microbumps. Still, any of a variety of other techniques may be used to attach dies 110, 115, and 120 to interposer 105. For example, bond wires or edge wires can be used to mechanically and electrically attach dies 110, 115, and 120 to interposer 105. In another example, an adhesive material can be used to mechanically attach dies 110, 115, and 120 to interposer 105. The attachment of dies 110, 115, and 120 to interposer 105 using solder bumps 205, as illustrated within FIG. 2, is provided for purposes of illustration and not intended as a limitation.

Interposer 105 includes one or more conductive layers 210 illustrated as dashed or dotted lines in interposer 105. Conductive layers 210 are implemented using any of a variety of metal layers as previously described. Conductive layers 210 are processed to form patterned metal layers that implement wires 215 of interposer 105. A wire implemented within interposer 105 that couples at least two different dies, e.g., dies 110 and 115, dies 115 and 120, or dies 110 and 120, is referred to as an inter-die wire. FIG. 2 shows several wires 215 that are considered inter-die wires for purposes of illustration. Wires 215 pass inter-die signals between dies 110, 115, and/or 120. For example, each of wires 215 couples two different solder bumps 205 beneath different ones of dies 110, 115, and/or 120, thereby allowing the exchange of inter-die signals between dies 110, 115, and/or 120. Wires 215 may be data wires or power wires. As noted, a power wire may be a Vcc power wire, e.g., a high voltage potential, or a Vss power wire having a ground or reference voltage potential.

Different ones of conductive layers 210 may be coupled together using vias 220. In general, a via structure is used to implement a vertical conductive path. In this regard, the vertical portions of wires 215 that contact solder bumps 205 are implemented as vias 220. The use of multiple conductive layers to implement interconnects within interposer 105 allows a greater number of signals to be routed and more complex routing of signals to be achieved within interposer 105.

Solder bumps 225 can be used to mechanically and electrically couple a second planar surface of interposer 105 to package substrate 230. In one aspect, solder bumps 225 can be implemented as controlled collapse chip connection (C4) balls. Package substrate 230 includes conductive paths (not shown) that couple different ones of solder bumps 225 to one or more nodes beneath package substrate 230. Accordingly, one or more of solder bumps 225 couple circuitry within interposer 105 to nodes external to IC 100 through circuitry or wiring within package substrate 230.

TVs 235 are vias that form an electrical connection that vertically transverses, e.g., extends through a substantial portion, if not the entirety of, interposer 105. TVs 235, like wires and vias, may be formed of any of a variety of different conductive materials including, but not limited to, copper, aluminum, gold, nickel, various silicides, and/or the like. As pictured, each of TVs 235 extends from a bottom surface of interposer 105 up to a conductive layer 210 of interposer 105. TVs 235 further may be coupled to a solder bump 205 through one or more of conductive layers 210 in combination with one or more vias 220.

The wire arrangements disclosed within this specification may be formed within any of the conductive layers 210 of interposer 105. Formation of wires 215 using the disclosed arrangements facilitates improved known good die testing of interposer 105. More particularly, implementing the wire arrangements described herein improves short circuit detection among wires 215 of interposer 105.

Figure 3:
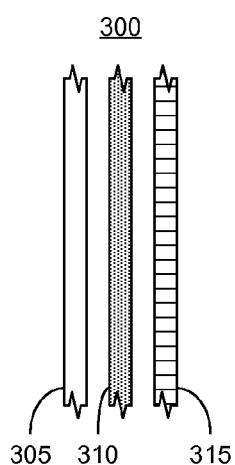
FIG. 3 is a diagram illustrating an exemplary wire arrangement.

FIG. 3 is a diagram illustrating an exemplary wire arrangement 300. Wire arrangement 300 may be implemented within a conductive layer 210, e.g., a patterned metal layer, of interposer 105. In some cases, more mature and less costly IC fabrication techniques are used to create interposer 105. Such is the case when, for example, interposer 105 is implemented as a passive die. Still, various types of failures may occur during the interposer manufacturing process. One type of failure, or defect, is caused by chemical mechanical planarization (CMP) processes. A CMP process may short two or more wires together. In the general case, such a defect shorts three wires together. Another type of failure is caused by collision of a large particle, e.g., greater than 2 μm, with the die. The large particle originates from outside of the die and also may short three or more wires together.

Wire arrangement 300 utilizes a wire placement and shielding technique that allows shorts to be detected more easily than with conventional shielding techniques. Within wire arrangement 300, the wire configured to carry data signals is shielded on each side by wires configured for use as power wires. Conventional shielding techniques utilize power wires of the same potential, e.g., two ground wires, when shielding a data wire. Wire arrangement 300, however, utilizes power wires of different voltage potentials to shield a data wire. When a data wire is shielded by two ground wires, for example, a short between the two ground wires is not detectable by probing the ground wires since by definition both ground wires are shorted together without a defect being present. By using power wires of different voltage potentials, a short circuit does not exist between the voltage supply wires when no defect exists. In that case, detection of a short circuit when probing two voltage supply wires configured for different voltage potentials does indicate a defect in the wiring of the interposer.

In the example pictured in FIG. 3, wire 310 is configured to carry a data signal and is illustrated with shading. Wire 310 is referred to herein as a data wire. Wire 315, having horizontal shading, is configured to convey a power signal of a selected voltage potential, e.g., a high voltage potential. Wire 315 may be Vcc, for example. As such, wire 315 is referred to herein as a Vcc power wire. Wire 305, having no shading, is configured to convey a power signal of a selected voltage potential, e.g., a low or reference voltage potential such as ground. Wire 305 is referred to herein as a Vss power wire. The voltage potential of Vss power wire 305 is different from the voltage potential of Vcc power wire 315.

As shown, data wire 310 is located between Vss power wire 305 and Vcc power wire 315. Further, each of wires Vss power wire 305, data wire 310, and Vcc power wire 315 is parallel, or substantially parallel. "Substantially" parallel means that the referenced wires are parallel within a defined or specified tolerance. As each of data wire 310, Vss power wire 305, and Vcc power wire 315 is implemented using a same conductive layer 210 within interposer 105, each of data wire 310, Vss power wire 305, and Vcc power wire 315 further is located within a same plane. The existence of a short circuit between Vss power wire 305 and Vcc power wire 315 indicates a defect. By comparison, conventional shielding techniques would place a ground wire on each side of data wire 310 making the wire arrangement untestable for purposes of known good die testing which occurs prior to die attachment.

Figure 4:
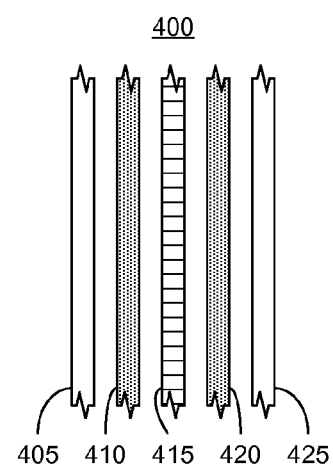
FIG. 4 is a diagram illustrating another exemplary wire arrangement.

FIG. 4 is a diagram illustrating another exemplary wire arrangement 400. Wire arrangement 400 illustrates a more complex arrangement than shown in FIG. 3. Like FIG. 3, wire arrangement 400 may be implemented within conductive layer 210 of interposer 105. For example, wire arrangement 400 may be implemented as part of a patterned metal layer within interposer 105.

In the example pictured in FIG. 4, two data wires 410 and 420 are shown. Data wire 410 is located between a Vss power wire 405, e.g., a power wire of a first voltage potential, and a Vcc power wire 415, e.g., a power wire of a second and different voltage potential. Data wire 420 is located between Vcc power wire 415 and a Vss power wire 425. In an alternative arrangement, wire 415 may be implemented as a Vss power wire while wires 405 and 425 are implemented as Vcc power wires.

Referring to FIGS. 3 and 4, it should be appreciated that, for testing purposes, only a segment of the data wire need be located between, and substantially parallel to, a segment of the Vss power wire and a segment of the Vcc power wire. As such, the entirety of each respective wire need not be parallel. Similarly, the entirety of the data wire need not be located between the Vss power wire and the Vcc power wire. Rather, only the segments need be parallel and the segment of the data wire need be located between the segment of the Vss power wire and the segment of the Vcc power wire. The term "segment," in reference to a data wire and/or a power wire, refers to a portion, or at least a portion, of the wire. A "segment," in reference to a wire, must conform with applicable, e.g., metal, design rules for the particular IC fabrication technology being used.

When a segment of a data wire is said to be located between a segment of a Vss power wire and a segment of a Vcc power wire, the segments are also aligned with respect to both starting and ending points. The starting and ending points of the data wire and the power wires need not be aligned. Referring to FIGS. 3 and 4, for example, the wires have a vertical orientation. Considering an x-y coordinate system, having aligned segments means that the y-coordinate of the starting point of the segment of the data wire is the same as the y-coordinate of the starting point of the segment of the Vss power wire and the same as the y-coordinate of the starting point of the segment of the Vcc power wire. Thus, a line struck perpendicular to the segment of the data wire that crosses the segment of the data wire also crosses the segment of the Vss power wire and the segment of the Vcc power wire. Appreciably, if the wires had a horizontal orientation, having aligned segments would mean that the x-coordinate of the starting point of the segment of the data wire is the same as the x-coordinate of the starting point of the segment of the Vss power wire and the same as the x-coordinate of the starting point of the segment of the Vcc power wire.

Figure 5:
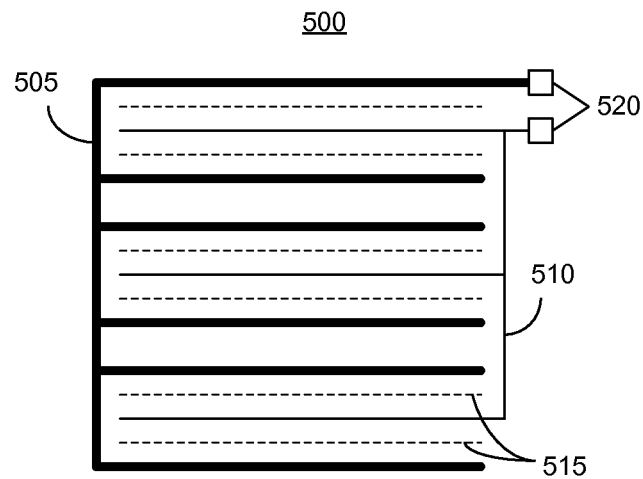
FIG. 5 is a diagram illustrating another exemplary wire arrangement.

FIG. 5 is a diagram illustrating another exemplary wire arrangement 500. Wire arrangement 500 may be implemented within conductive layer 210 of interposer 105. For example, the wires of wire arrangement 500 may be implemented as part of a patterned metal layer within interposer 105.

For purposes of illustration, data wire 515 is illustrated using dashed lines. Vcc power wire 505 is illustrated using solid lines with bolding. Vss power wire 510 is illustrated using solid lines without bolding. Vcc power wire 505, data wire 515, and Vss power wire 510 are substantially parallel. As pictured, segments of Vcc power wire 505, segments of data wire 515, and segments of Vss power wire 510 are substantially parallel. Further, segments of data wire 515 are located between segments of Vcc power wire 505 and segments of Vss power wire 510. In some cases, however, one or more of the aforementioned wires, e.g., Vcc power wire 505 and/or Vss power wire 510, have connecting portions, or segments, that may be perpendicular to data wire 515.

In the example pictured in FIG. 5, each of Vcc power wire 505 and Vss power wire 510 is coupled to a probe structure 520. In one example, probe structures 520 are implemented as probe pads. The probe pads may be implemented as part of the interposer or off the interposer. In another example, probe structures 520 are implemented as solder bumps. Regardless of implementation, probe structures 520 are sized so that each may be probed, e.g., may mechanically and electrically contact a probe head, to detect a short circuit condition between Vcc power wire 505 and Vss power wire 510. A detected short circuit would indicate that data wire 515 is also shorted.

Figures 1, 6:
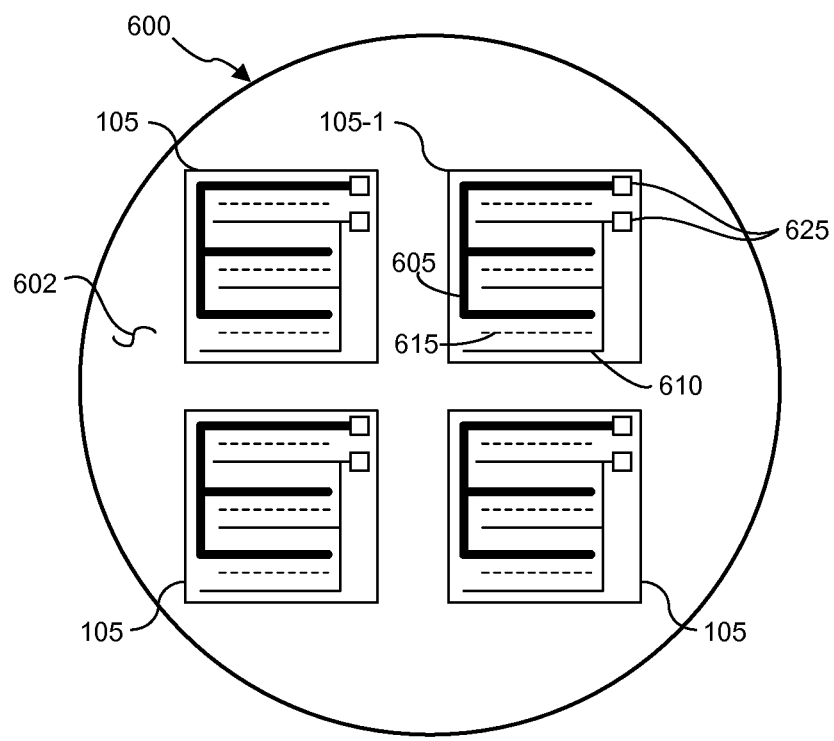
Figures 2, 6:
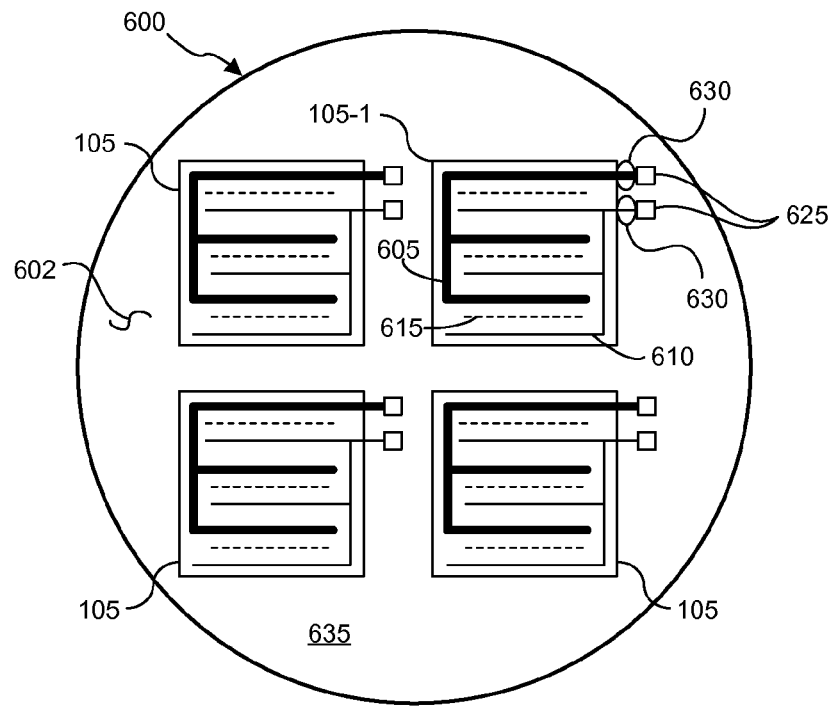

FIGS. 6-1 and 6-2 are top views of an exemplary interposer wafer 600. FIG. 6-1 illustrates an implementation where the probe structures are implemented as probe pads as part of each respective interposer. Interposer wafer 600 includes a plurality of interposers 105 still in wafer form. A front side surface 602, e.g., the top, of interposer wafer 600 is illustratively depicted. Each of interposers 105 is shown having a conductive layer 210, e.g., a patterned metal layer, implemented therein. Conductive layer 210 is implemented beneath one or more other process layers of interposers 105 when fully formed. As such, conductive layer 210 within each of interposers 105 would be obstructed from view by such other layers. FIG. 6 illustrates conductive layer 210 to better demonstrate the implementation of the wire arrangements described within this disclosure.

As part of conductive layer 210, Vcc power wire 605, data wire 615, and Vss power wire 610 are illustrated. The same convention as described with reference to FIG. 5 is used within FIG. 6. In particular, data wire 615 is illustrated using dashed lines. Vcc power wire 605 is illustrated using a solid, bolded line. Vss power wire 610 is illustrated as a solid line without bolding.

Each of Vcc power wire 605 and Vss power wire 610 is coupled to a probe structure and, more particularly, to a probe pad 625. Each of probe pads 625 is implemented as part of interposer 105 and, as such, is located within the perimeter defining each respective one of interposers 105. While conductive layer 210 is hidden from view in interposers 105, probe pads 625 would be exposed so that a probe may make contact with each of probe pads 625.

The wire arrangements illustrated in any of FIGS. 3, 4, 5, and 6 may be replicated throughout interposers 105 as required to provide extensive test coverage for wires. The examples provided connect probe structures only to power wires. Probe structures are not coupled to data wires. Accordingly, the impedance of data wires is not altered or modified in any way that would result in reduced high frequency performance.

FIG. 6-2 illustrates an implementation where the probe structures are implemented as probe pads, but are not part of each respective interposer. FIG. 6-2 is substantially similar to that of FIG. 6-1. In FIG. 6-2, however, probe pads 625 are implemented within a scribe region 635 of interposer wafer 600.

Each of Vcc power wire 605 and Vss power wire 610 is coupled to a probe structure and, more particularly, to a probe pad 625. Each of probe pads 625 is implemented within scribe region 635 of interposer wafer 600. Scribe region 635 includes any portion of interposer wafer 600 that is located outside of a perimeter of any one of interposers 105 implemented within interposer wafer 600. When interposer wafer 600 is diced into a plurality of individual interposers 105, the cuts that separate individual ones of interposers 105 are made in scribe region 635.

In one aspect, the portion of a wire that extends beyond the perimeter of interposer 105 and into scribe region 635 is referred to as a metal stub. Metal stubs 630 are illustrated in FIG. 6-2. Accordingly, each of Vcc power wire 605 and Vss power wire 610 connects to a respective probe pad 625 via a metal stub 630. The wire arrangements illustrated in any of FIGS. 3, 4, 5, and 6 may be replicated throughout interposers 105 as required to provide extensive test coverage for wires of the interposers.

When creating layers of interposers 105 in interposer wafer 600, the size of the layer for an interposer, e.g., a conductive layer, or the like, may be sized smaller than the size of the reticle or scan window used. For purposes of illustration, consider the case in which the scan window used for interposer wafer 600 is 26×33 mm. Each of interposers 105 may be sized smaller, e.g., at 20×20 mm. The reticle can be stepped or moved in increments of 20.1×20.1 mm. This movement provides a portion of scribe region 635 that is 0.1 mm in width between adjacent ones of interposers 105. Metal stubs 630 and probe pads 625 may be implemented within this portion of scribe region 635. Metal stubs 630 and probe pads 625 may be approximately 60-70 microns long.

Being implemented in scribe region 635, metal stubs 630 are severed when interposer wafer 600 is diced into multiple individual interposers 105. In one aspect, the area in scribe region 635 need not be built up in the same manner as other portions of interposer wafer 600 that correspond to interposers 105. When a metal stub and probe pad are formed, such structures need not be covered by insulating layers since the structures are intended to be probed for testing of known good dies. Metal stub 630 and probe pad 625 can be left exposed thereby facilitating probing and short circuit testing.

Metal stubs 630 and probe pads 625 may be implemented to extend from any side, or sides, of interposer 105. The location of metal stubs 630 and probe pads 625 is for purposes of illustration only and not intended as a limitation. In other examples, metal stubs 630 and probe pads 625 may extend from the top, bottom, left, or right sides of interposers 105. Further, when more than one wire arrangement is implemented within each interposer 105, two or more sets of metal stubs and probe pads may be included. As such, one or more or all sides of each interposer 105 may have one or more sets of metal stubs 630 and probe pads 625 extending therefrom.

The example described with reference to FIG. 6-2 provides a benefit in that substantial changes to masks used to implement interposers within interposer wafer 600 are not required. By making small variations to a mask or reticle of a conductive layer, metal stubs and corresponding probe pads may be implemented without incurring any substantial cost and/or redesign of the interposer itself. Further, by connecting probe pads only to power wires, the impedance of data wires is not altered or modified in any way that would result in reduced high frequency performance.

Figures 1, 7:
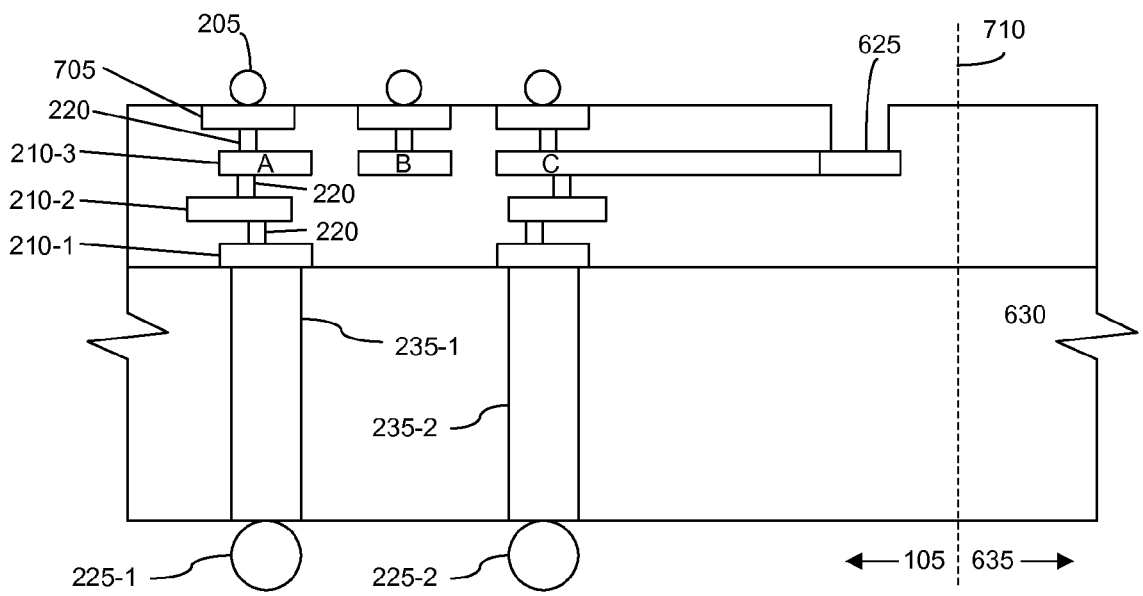
Figures 2, 7:
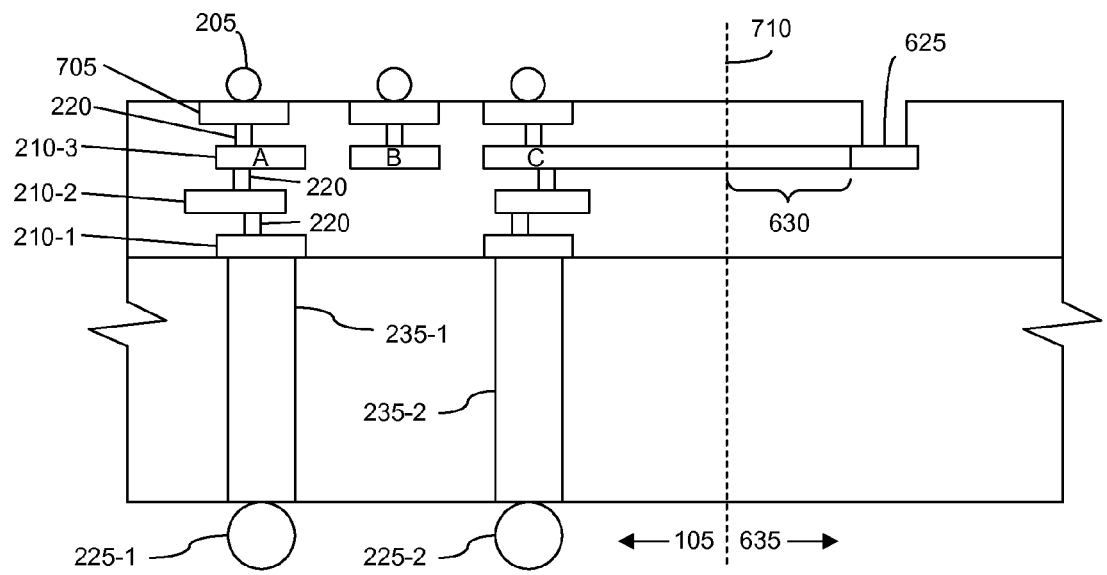

FIGS. 7-1 and 7-2 are diagrams illustrating exemplary portions of the interposer wafers of FIGS. 6-1 and 6-2, respectfully, in cross section. FIG. 7-1 illustrates a portion of the interposer wafer of FIG. 6-1 in cross section. Accordingly, FIG. 7-1 illustrates an example where probe pads are implemented as part of each respective interposer 105.

As shown, a portion, or edge, of an interposer 105 is illustrated. The portion of interposer 105 is separated from scribe region 635 of the interposer wafer by perimeter 710. In one aspect, perimeter 710 represents a die seal ring. Interposer 105 includes conductive layers 210-1, 210-2, and 210-3 which form wires. Interposer 105 also includes vias 220 formed in via layers. The interposer further includes UBM layer 705 beneath solder bumps 205. Further layers, e.g., insulating layers and otherwise, that are not illustrated in FIG. 7 may be included. FIG. 7 is provided as a simplified example of interposer wafer 600 for purposes of description and illustration.

As pictured, a wire of conductive layer 210-3 extends out to form a probe pad 625. For purposes of illustration, consider the case where wire A in conductive layer 210-3 is a Vcc power wire. Wire B in conductive layer 210-3 is a data wire. Wire C in conductive layer 210-3 is a Vss power wire. The probe pad that is formed and connected to Vcc power wire A is not illustrated. For example, the probe pad may be hidden from view within FIG. 7-1.

While conductive layer 210-3 is illustrated as implementing the wire arrangement described herein, it should be appreciated that the wire arrangement also may be implemented in conductive layer 210-2. As such, wires A, B, and C may be implemented in conductive layer 210-2, as would be probe pad 625.

In another example, rather than using probe pads such as probe pad 625, solder bumps 225 may be used as the probe structures. For example, solder bump 225-1 connects to TV 235-1 and to wire A which is a Vcc power wire. Solder bump 225-2 connects to TV 235-2 and to wire C which is a Vss power wire. In such a configuration, probes may contact each of solder bumps 225-1 and 225-2 to determine whether a short circuit exists.

When using solder bumps 225 as the probe structure, the solder bumps used to connect to the Vcc power wire and the Vss power wire may be implemented as dummy bumps. A dummy bump is left floating when the multi-die IC is finished. The dummy bump performs a structural function in helping to attach interposer 105 to package substrate 230. Dummy bumps, however, are not electrically connected to any circuitry within package substrate 230 and, as such, do not connect to any node external to the resulting multi-die IC, e.g., IC 100.

In another aspect, solder bumps 225 and, in particular solder bumps 225-1 and 225-2, are not dummy bumps. In that case, each of solder bumps 225-1 and 225-2, being part of the wire arrangement, may be electrically connected to circuitry within package substrate 230 when interposer 105 is attached thereto. As such, each of solder bumps 225-1 and 225-2 are electrically functional in the finished IC 100 and connect the Vcc power wire and the Vss power wire to nodes external to IC 100. It should be appreciated that there may be more than one TV-solder bump pair for Vss and Vcc. Each interposer 105 may have a plurality of such pairs thereby providing redundancy for Vss and/or Vcc nodes. Accordingly, in some configurations, a given wire arrangement of a Vcc power wire, a data signal, and a Vss power wire may be tested using any of a plurality of different TV-solder bump pairs.

FIG. 7-2 illustrates a portion of the interposer wafer of FIG. 6-2 in cross section. Accordingly, FIG. 7-2 illustrates an example where probe pads 625 are implemented outside of each interposer 105 within scribe region 635 of the interposer wafer. As shown, a portion, or edge, of an interposer 105 is illustrated. FIG. 7-2 is substantially similar to FIG. 7-1 with the exception that wire C extends beyond perimeter 710 of interposer 105 and into scribe region 635 of the interposer wafer. As previously noted, in one aspect, perimeter 710 represents a die seal ring. As pictured, wire C of conductive layer 210-3 extends out beyond perimeter 710 where metal stub 630 couples to probe pad 625. Appreciably, wire A also would extend beyond perimeter 710 and couple to a probe pad 625 through a metal stub 630.

As noted with reference to FIG. 7-1, while conductive layer 210-3 is illustrated as implementing the wire arrangement described herein, it should be appreciated that the wire arrangement also may be implemented in conductive layer 210-2. As such, wires A, B, and C may be implemented in conductive layer 210-2, as would be probe pad 625 and metal stub 630.

In some cases, probe pads within interposers may be used for testing interposers without using solder bumps as probe structures. In another aspect, solder bumps may be used as probe structures in which case probe pads need not be formed. In yet other cases, probe pads and metal stubs may be used for testing interposers. In still other cases, any two or more of the aforementioned techniques may be used concurrently in different combinations for testing purposes, e.g., probe pads and solder bumps, probe pads on an off the interposer, solder bumps with probe pads off the interposer, or all three concurrently for testing a same interposer.

Figure 8:
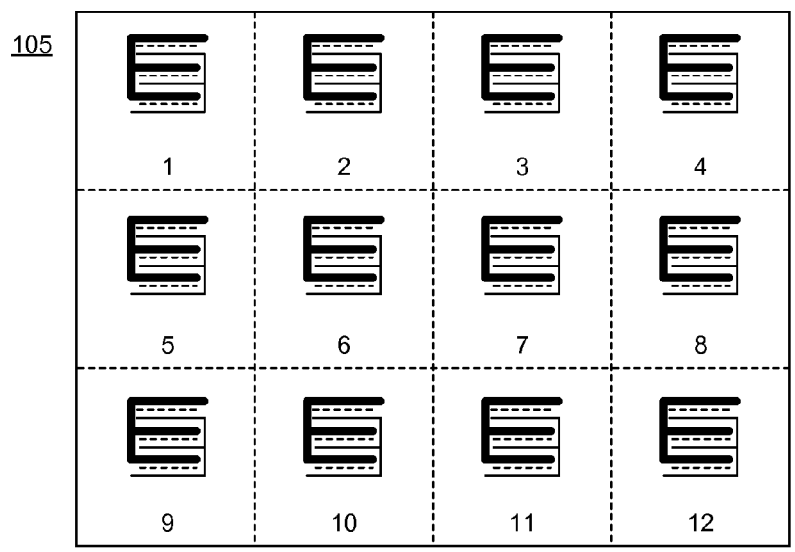
FIG. 8 is a diagram illustrating an exemplary test technique utilizing the wire arrangements described herein.

FIG. 8 is a diagram illustrating an exemplary test technique utilizing the wire arrangements described herein. As shown, interposer 105 is divided into a plurality of different physical regions. Each physical region includes one wire arrangement where a data wire, or segment thereof, is shielded by a Vcc power wire and a Vss power wire or segments of each respective power wire. As noted, the Vcc power wire and the Vss power wire are configured to carry different voltage potentials and, as such, are not intended to be shorted together within interposer 105. For ease of illustration, the probe structures, whether probe pads or solder bumps, are not illustrated. Each region and, as such, wire arrangement, however, has its own set of probe structures to facilitate testing of each region and wire arrangement independently of each other region and wire arrangement. Thus, when a short circuit is detected, the relative location of the short circuit may be used to determine which data wire is likely shorted.

Figure 9:
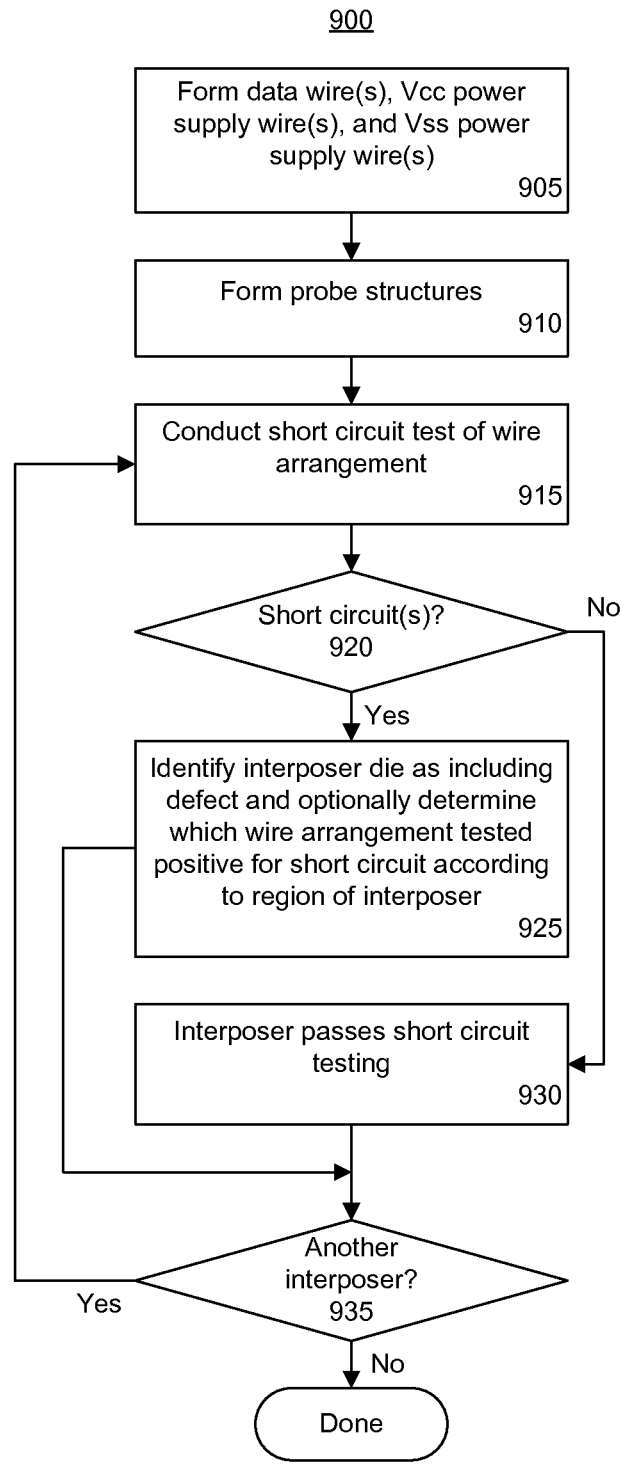
FIG. 9 is a flow chart illustrating an exemplary method of creating and testing interposers.

FIG. 9 is a flow chart illustrating an exemplary method 900 of creating and testing interposers. Method 900 begins in a state where interposers are being created within an interposer wafer. For purposes of discussion and illustration, various process steps relating to the formation of vias, TVs, and the like are not described in detail.

In block 905, data wire(s), Vcc power wire(s), and Vss power wire(s) are implemented within each interposer of the interposer wafer. The data wire is located between the Vcc power wire and the Vss power wire. As noted, in one aspect, a segment of the data wire is located between, and substantially parallel to, a segment of the Vcc power wire and a segment of the Vss power wire. Further, multiple ones of the aforementioned wire arrangement may be implemented within each interposer and within each conductive layer of each interposer within the interposer wafer.

In block 910, probe structures are formed. As discussed, in one aspect, the probe structures are implemented as probe pads connected to the appropriate power wires. The probe pads may be implemented as part of the interposer or off the interposer. When the probe pads are not part of the interposer, the probe pads and metal stubs are located within the scribe region of the interposer wafer. In another example, the probe structures are implemented as solder bumps on the surface of the interposers that attaches to the package substrate, e.g., the surface of the interposer wafer opposite the top surface. The probe structures are formed so that each Vss power wire and each Vcc power wire used as a shield for a data wire, as described, connects to a probe structure thereby enabling short circuit testing of the wire arrangement.

For purposes of clarity, the following generally describes the formation of wires within the interposers. For example, the conductive layer may be applied to the interposer wafer. A photoresist then may be applied to the conductive layer. A reticle is positioned for a selected interposer. The reticle has an image for the various wires to be formed in the conductive layer of each interposer. A region that encompasses an interposer is exposed to ultraviolet light. Accordingly, those portions of the reticle that are transparent expose the photoresist beneath to the ultraviolet light. Those portions of the reticle that are opaque prevent exposure of the photoresist beneath. The pattern to be implemented within the conductive layer is applied to the photoresist for the selected interposer.

The resulting pattern not only specifies the various wires to be implemented, but in the case where the probe structures are to be implemented as probe pads in the scribe region of the interposer wafer, the resulting pattern further specifies the metal stubs and probe pads. Further interposers of the interposer wafer may be processed in the same manner. As such, a stepper moves the reticle as required to implement the wires for further interposers of the interposer wafer. The exposed photoresist is washed. The unwanted portions of the conductive layer are removed leaving a patterned conductive layer forming the data wire(s), Vcc power wire(s), and the Vss power wire(s) for each interposer of the interposer wafer.

The procedures for forming solder bumps are well known in the art. Any known method for forming solder bumps may be used. For example, solder bumps may be formed or placed on a UBM layer of the interposer using evaporation, electroplating, printing, jetting, stud bumping, and/or direct placement. It should be appreciated that the foregoing is provided for purposes of illustration only and not limitation.

Other fabrication techniques may be used to create wire arrangements and/or probe structures for purposes of short circuit testing as described. Further, while the example provided was illustrated with a positive photoresist, it should be appreciated that a negative photoresist may be used. In any case, after block 910, one or more other process steps may be performed so that the interposers of the interposer wafer are considered complete or fully formed and ready for known good die testing.

In block 915, test equipment is used to conduct, or perform, a short circuit test of the wire arrangement(s) for a selected interposer in the interposer wafer. The wire arrangement(s), for example, are probed using the probe structures. For each wire arrangement, a first probe is placed in mechanical and electrical contact with a first probe structure coupled to a first power wire such as a Vcc power wire. A second probe is placed in mechanical and electrical contact with a second probe structure coupled to a second power wire such as a Vss power wire. Though described separately, it should be appreciated that the probe placement may be performed concurrently or in a different, e.g., reverse, order. The Vcc power wire and the Vss power wire shields a data wire as described within this disclosure.

In block 920, the test equipment determines whether a short circuit is detected. The determination can be made for each wire arrangement that is probed. If a short circuit is detected, method 900 continues to block 925. If not, however, method 900 proceeds to block 930.

In block 925, when one or more short circuits are detected, the test equipment identifies the interposer as including a defect. Further, if multiple different wire arrangements are included in the interposer where each wire arrangement is included in a known physical region, the test equipment may store or record the particular wire arrangement, and thus, region, in which the short circuit was detected for subsequent use and/or evaluation. For example, responsive to identifying a short circuit from the short circuit test, the test equipment determines a location, or an approximate location, of the short circuit by identifying a region from a plurality of different regions of the die that includes the Vcc power wire and the Vss power wire that were found to be shorted and/or the segment of the Vcc power wire and the segment of the Vss power wire that were found to be shorted.

In block 930, when no short circuits are detected within the interposer, the test equipment identifies the interposer as having passed the short circuit test. In one example, the interposer may be identified as being a known good die. It should be appreciated, however, that further testing may be required before the interposer is certified as being a known good die.

In block 935, the test equipment determines whether another interposer of the interposer wafer requires short circuit testing. If so, method 900 selects a next interposer of the interposer wafer for testing and loops back to block 915. If no further interposer require testing, method 900 can end.

While method 900 was described as a process performed while interposers are still in wafer form, it should be appreciated that interposers can be tested for short circuits after dicing. If so, the probe structures used would be other solder bumps or probe pads on each diced interposer since dicing would destroy any probe structures formed of metal stubs and probe pads in the scribe region of the interposer wafer.

The inventive arrangements disclosed within this specification provide a wire arrangement for use within ICs. Data wires may be shielded using power supply wires configured to carry different voltage potentials. As such, in addition to shielding the data lines, the resulting wire arrangement facilitates short circuit testing of the die and/or IC without having to include additional test structures that consume die area. Further, because probe structures are connected to the power supply wires, the impedance of the data wires is not disturbed. Accordingly, the data wire may be tested for short circuits while the ability of the data wire to carry high frequency signals is preserved.

The examples provided within this disclosure were described using a passive die. It should be appreciated, however, that the wire arrangements and testing techniques described also may be applied and used for active dies. In this regard, the wire arrangement, formation thereof, and use thereof for short circuit testing may be performed using passive dies and active dies as desired. Use of passive interposer dies as illustrative examples recognizes the inherent difficulties in testing passive dies since active devices are not available within such dies for testing purposes.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

The flowchart and block diagrams in the figures illustrate the architecture, functionality, and operation of possible implementations of process(es), machine(s), manufacture(s), and/or systems utilizing one or more of the features described herein. In some alternative implementations, the functions noted in the blocks may occur out of the order noted in the figures. For example, two blocks shown in succession may be executed substantially concurrently, or the blocks may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed.

The features disclosed within this specification can be embodied in other forms without departing from the spirit or essential attributes thereof. Accordingly, reference should be made to the following claims, rather than to the foregoing specification, as indicating the scope of such features and implementations.

What is claimed is:

1. An integrated circuit, comprising:
a passive die comprising a conductive layer;
wherein the conductive layer comprises a data wire, a first power supply wire of a first voltage potential, and a second power supply wire of a second voltage potential different from the first voltage potential;
wherein a segment of the data wire is located between, and substantially parallel to, a segment of the first power supply wire and a segment of the second power supply wire;
wherein the first power supply wire is coupled to a first probe structure and the second power supply wire is coupled to a second probe structure;
wherein the passive die is configured as a common mounting surface for a plurality of dies and to electrically couple the plurality of dies using the first power supply wire, the second power supply wire, and the data wire; and
wherein the passive die is configured for detecting short circuits between the first power supply wire, the second power supply wire, and the data wire.

2. The integrated circuit of claim 1, wherein the first probe structure and the second probe structure are implemented as probe pads in a scribe region of a wafer in which the die is formed.

3. The integrated circuit of claim 2, wherein:
the first power supply wire is coupled to the first probe structure by a first metal stub that extends beyond a perimeter of the die into the scribe region of the wafer; and
the second power supply wire is coupled to the second probe structure by a second metal stub that extends beyond the perimeter of the die into the scribe region of the wafer.

4. The integrated circuit of claim 1, wherein the first probe structure and the second probe structure are implemented as probe pads that are part of the die.

5. The integrated circuit of claim 1, wherein the first probe structure and the second probe structure are implemented as solder bumps on a surface of the die that couples to a package substrate.

6. The integrated circuit of claim 5, wherein the solder bumps are dummy bumps that are not electrically connected to circuitry within the package substrate.

7. The integrated circuit of claim 5, wherein the solder bumps electrically connect to circuitry within the package substrate.

8. The integrated circuit of claim 1, wherein:
the die comprises a plurality of different physical regions; and
the segment of the data wire, the segment of the first power supply wire, and the segment of the second power supply wire are implemented in a selected one of the plurality of physical regions.

9. A wafer, comprising:
a plurality of passive dies separated by portions of a scribe region;
a plurality of first probe structures; and
a plurality of second probe structures;
wherein each die comprises a conductive layer forming a data wire, a first power supply wire configured for a first voltage potential, and a second power supply wire configured for a second voltage potential different from the first voltage potential;
wherein a segment of the data wire is located between, and substantially parallel to, a segment of the first power supply wire and a segment of the second power supply wire;
wherein each first power supply wire is coupled to a different first probe structure of the plurality of first probe structures;
wherein each second power supply wire is coupled to a different second probe structure of the plurality of second probe structures; and
wherein each passive die is configured as a common mounting surface for a plurality of dies and to electrically couple the plurality of dies using the first power supply wire, the second power supply wire, and the data wire; and
wherein each passive die is configured for detecting short circuits between the first power supply wire, the second power supply wire, and the data wire.

10. The wafer of claim 9, wherein:
the first plurality of probe structures and the second plurality of probe structures are implemented as probe pads in a scribe region of the wafer.

11. The integrated circuit of claim 10, wherein:
each first power supply wire is coupled to the first probe structure by a first metal stub that extends beyond a perimeter of the die into the scribe region of the wafer; and
each second power supply wire is coupled to the second probe structure by a second metal stub that extends beyond the perimeter of the die into the scribe region of the wafer.

12. The wafer of claim 9, wherein:
the first plurality of probe structures and the second plurality of probe structures are implemented as probe pads that are within the plurality of dies.

13. The wafer of claim 9, wherein:
the first plurality of probe structures and the second plurality of probe structures are implemented as solder bumps on a surface of the dies that couples to a package substrate.

14. The integrated circuit of claim 13, wherein the solder bumps are dummy bumps that are not electrically connected to circuitry within the package substrate.

15. A method, comprising:
forming a data wire, a first power supply wire, and a second power supply wire within a conductive layer of a passive die;
wherein a segment of the data wire is located between a segment of the first power supply wire and a segment of the second power supply wire;
forming a first probe structure coupled to the first power supply wire;
forming a second probe structure coupled to the second power supply wire; and
conducting a short circuit test of the first power supply wire and the second power supply wire using the first probe structure and the second probe structure;
wherein the passive die is configured as a common mounting surface for a plurality of dies and to electrically couple the plurality of dies using the first power supply wire, the second power supply wire, and the data wire; and
wherein the passive die is configured for detecting short circuits between the first power supply wire, the second power supply wire, and the data wire.

16. The method of claim 15, wherein conducting a short circuit test comprises:

contacting a first probe to the first probe structure;
contacting a second probe to the second probe structure; and
determining whether the first power supply wire is shorted with the second power supply wire.

17. The method of claim 16, further comprising:
responsive to identifying a short circuit from the short circuit test, determining a location of the short circuit according to a region that includes the segment of the data wire between the segment of the first power supply wire and the segment of the second power supply wire from a plurality of different regions of the die.

18. The method of claim 15, wherein the first probe structure and the second probe structure are probe pads formed within a scribe region of a wafer including the die.

19. The method of claim 15, wherein the first probe structure and the second probe structure are implemented as probe pads that are part of the die.

20. The method of claim 15, wherein the first probe structure and the second probe structure are solder bumps formed on a surface of the die that couples to a package substrate.

\* \* \* \* \*